May 31, 1960

F. A. MULLER 2,939,056

TRANSISTOR

Filed Aug. 5, 1954

INVENTOR
FRED A. MULLER
BY Henry Kolin
AGENT

United States Patent Office 2,939,056

Patented May 31, 1960

2,939,056

TRANSISTOR

Fred A. Muller, Pompton Plains, N.J., assignor to International Telephone and Telegraph Corporation, Nutley, N.J., a corporation of Maryland Filed Aug. 5, 1954, Ser. No. 448,050

10 Claims. (Cl. 317—235)

This invention relates to a novel type of semiconductor device and is more particularly directed to a novel hook-collector junction transistor and a method for making it.

Transistors or crystal triodes of the silicon and germanium type are well-known and are commercially available in two general types. The first of these, the point-contact transistor, consists of a bar of semiconductive material, such as germanium, having an excess or deficiency of electrons and having two pointed electrodes, known as the emitter and collector electrodes, closely spaced together in contact with one surface of the bar and a base electrode in contact with the other surface. The second type, the junction transistor, consists of a body of semiconductive material having two zones of similar conductivity type separated by a zone of the opposite conductivity type. The two zones of the same conductivity type are contiguous with the opposite faces of the zone of opposite conductivity type, external electrical connection being made to each of these zones. These zones form a so-called sandwich of the n-p-n or p-n-p type, where n refers to a semiconductor having an excess of electrons and p refers to a semiconductor having a deficiency of electrons, or an excess of "holes." The method of preparing these point-contact and junction transistors is well-known in the art. The junction type, depending upon its method of preparation, is referred to as an alloy-junction transistor or a grown-junction transistor.

The point-contact transistor has a current gain, alpha, greater than 1. Alpha, the current gain of the transistor, is defined as $$\alpha=-\left(\frac{\partial i_c}{\partial i_e}\right)v_c=k$$

where the subscripts $c$ and $e$ refer respectively to the collector and emitter electrodes of the transistor, $i$ refers to current, $v$ refers to voltage and $k$ is a constant. It has been found that for certain important applications in computer matrix circuits, the use of transistors having a value of alpha greater than 1 is extremely advantageous. While point-contact transistors meet this requirement for alpha, they have certain other properties which render them less suitable for use in these matrix circuits as an element in a bistable flip-flop circuit. Thus, point-contact germanium transistors are noisy, unstable and inconstant in their operation and consume excessive amounts of power. For this reason junction transistors are largely preferred for use as elements in bistable flip-flop circuits. The junction transistors are relatively stable in operation and require low amounts of power to maintain them in the conducting condition. However, n-p-n or p-n-p junction transistors as now known and prepared have a value of alpha less than 1. Because of this, at least two such transistors are needed to construct a bistable flip-flop element. Inasmuch as several hundred such elements are needed in the construction of typical computer circuits, for economic reasons a junction transistor with an alpha greater than 1 would be extremely desirable inasmuch as only one such unit would be required for switching purposes in comparison with the two such units now required for each bistable flip-flop element.

It is an object of the present invention, therefore, to provide a novel type of junction transistor having a current gain, alpha, greater than 1.

It is an additional object to provide such a transistor having the desirable characteristics of junction transistors.

It is a further object to provide a transistor having superior properties for use as an element in flip-flop switching circuits.

It is still an additional object to provide a relatively simple method for producing a junction type transistor having a current gain greater than 1.

It is a feature of this invention that a novel junction transistor is provided wherein an alloy-type zone of opposite conductivity type is formed within one of two similar type conductivity zones in a grown-junction crystal by an alloyable emitter connection.

It is an additional feature that no external electrical connection is made to the intermediate opposite-conductivity layer of the junction transistor.

Other objects and features of this invention will be seen from the drawings taken in conjunction with the following description in which.

Figures 1, 1A:
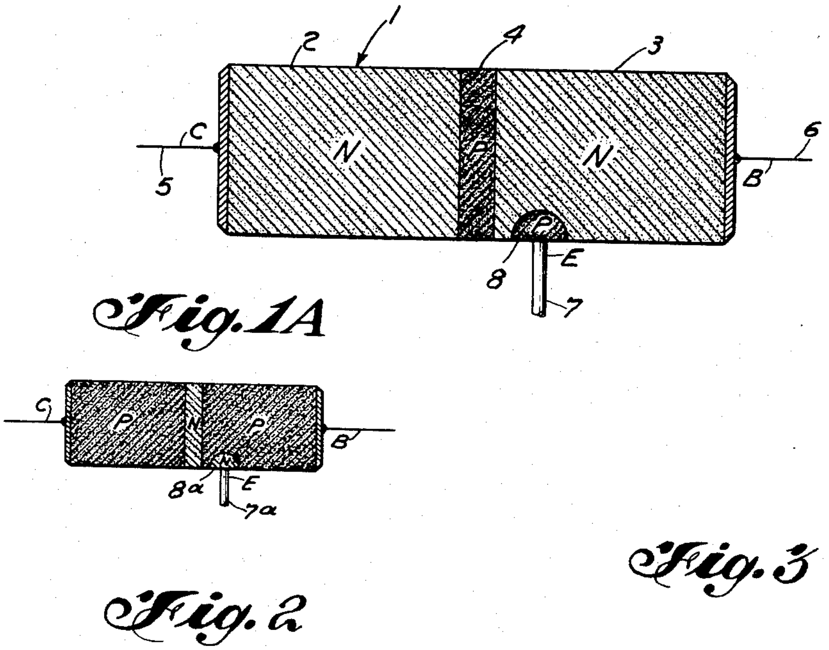
Fig. 1 is a schematic view partly in section of the novel type of junction transistor.
Fig. 1A is a schematic view partly in section of another embodiment of the novel type of junction transistor.

Referring to Fig. 1, a hook-collector junction transistor 1 is shown in which 2 and 3 are n-type germanium layers containing an excess of electrons and 4 is a p-layer of germanium containing a deficiency of electrons or excess of "holes." The n-p-n crystal itself may be readily prepared by methods known in the art, and for the practice of this invention is a grown-junction crystal, and preferably of germanium. The process of preparing an improved type n-p-n grown-junction crystal has been described, for example, in the copending application of P. E. Lighty, Serial No. 434,865, filed June 7, 1954, now Patent No. 2,928,030. However, after the n-p-n crystal has been grown and the germanium suitably etched, the external lead wires to the crystal are connected in a manner somewhat different from that of the conventional arrangement for making an n-p-n transistor where the crystal is used as an amplifier element. Thus, the two n-type layers usually have different values of resistivity and the collector electrode 5 is preferably attached to the n-type germanium 2 which has the lower resistivity, such as approximately .1 ohm-centimeter. The base electrode 6 is preferably attached to the n-type germanium 3 which has the higher resistivity, such as approximately 2 ohm-centimeters. However, and this is important for the practice of my invention, the wire used for the emitter 7 is not connected to the intermediate p-type region 4. Preferably, the connection is made to this intermediate region. The emitter wire 7 is bonded or alloyed into the higher resistivity n-type germanium 3 region at a point close to the p region 4, but not making contact therewith.

The emitter 7 not only makes connection to the higher resistivity germanium, but, as an essential feature of this invention, forms a zone of alloyed germanium 8 of opposite conductivity type within the larger germanium zone 3. In this regard it is important to observe that the wire used for bonding or alloying to the n-type germanium must be of an alloyable type. I have found that to accomplish this zone formation, the emitter wire 7 is preferably a gold wire containing an acceptor type of impurity such as gallium, indium or aluminum. The use of a gallium-containing gold wire as the emitter electrode is particularly desirable. The use of typical point-contact type wires for the emitter connection, such as phosphor bronze or tungsten wires, is considered unsuitable for the practice of this invention because of the resulting noise, instability, and lack of reproducible characteristics obtained with the latter. An electric pulse may be used to weld the emitter wire in place and at the same time convert the n-germanium directly beneath the wire into an alloy-type p-type germanium layer 8, resulting in the configuration shown in Fig. 1. The collector and base connections are made to opposite ends of the germanium bar in an "ohmic" manner. No connection is made to the thin intermediate p-layer 4 which is present in the crystal between the two n layers. The fabrication of these novel devices is considerably simpler than that of conventional n-p-n transistors inasmuch as there is no need in the preferred embodiment of my invention for attaching a wire to a thin p-layer often of the same dimensions as the wire itself. Thereby mechanically difficult connections are eliminated.

In Fig. 1A is shown another embodiment of the hook-collector junction transistor of the subject invention. A p-n-p grown-junction crystal is prepared in a manner similar to that used in the preparation of the n-p-n crystal, and the base and collector electrodes are connected in the manner illustrated. The emitter *7a* consists preferably of a gold wire containing a donor type of impurity such as antimony or arsenic. An electric pulse may be used to weld the emitter wire in place and at the same time convert the p-germanium directly beneath the wire into an alloy-type n-germanium layer *8a*, resulting in the configuration shown in Fig. 1A.

For a typical n-p-n crystal, the two n regions are approximately 0.05 inch in width with the intermediate p region approximately 0.002 inch in width. The gold wire is alloyed to the base-connected n region at a point approximately 0.002 to 0.005 inch from the intermediate p-layer. The lifetime of minority carriers in the base-connected and intermediate regions should be high, in excess of 5 microseconds.

Figure 2:
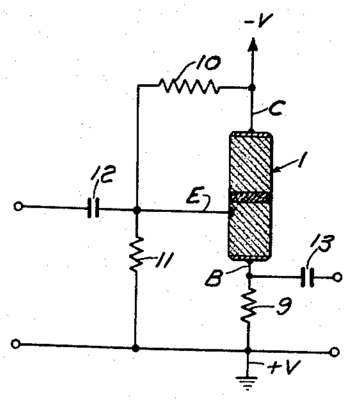
Fig. 2 is a schematic view of a flip-flop circuit utilizing the transistor of the subject invention.

In Fig. 2 is shown a bistable flip-flop circuit using only a single transistor 1 of the subject invention. Where conventional junction-type transistors are used, two such transistors are required for each element of the flip-flop circuit. Since such elements are multiplied a hundred fold to form certain computer circuits, a considerable economy in the use of transistors as well as a lowered power consumption results from the practice of the present invention. For purposes of illustration, the following are typical circuit parameters used to obtain bistable operation of the circuit shown in Fig. 2. A hook-collector junction transistor 1 is shown in this figure with collector C, emitter E and base B electrodes connected as shown. The base resistor 9 had a nominal value of 4700 ohms. Resistors 10 and 11 connected to the emitter electrode each had values of 10,000 ohms. Values of 10 microfarads for capacitors 12 and 13 were found suitable. The voltage across resistor 9 was about 1.4 volts when in the "on" or highly conducting condition, and 0.8 volt when in the "off" condition. The circuit was turned to the "on" position with a 1.5-volt negative pulse on the base or a positive pulse on the emitter. To change to the "off' position, a 1.5-volt positive pulse on the base or negative on the emitter was employed.

Figure 3:
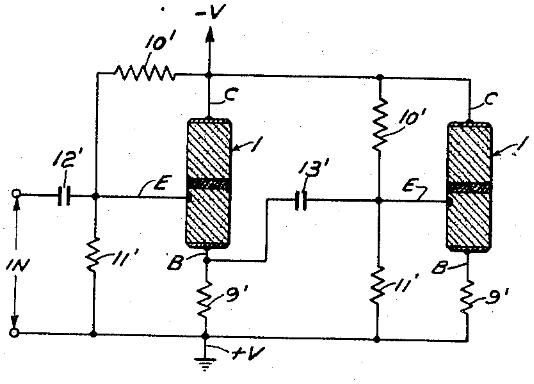
Fig. 3 is a schematic view of a two-stage flip-flop circuit element useful in a ring counter circuit.

In Fig. 3 is shown a circuit useful as part of a basic ring counter circuit employed, for example, in digital computer devices. A two-stage circuit has been illustrated, although it is apparent that many successively coupled stages may be used depending upon the type of computer circuit involved. For each such stage, a single transistor of the subject invention may be employed in place of the two conventional-type junction transistors now required. The circuit illustrated in Fig. 3 was operated as follows. A positive input pulse turned the first stage, i.e., that stage first triggered, to "on" and the second stage to "off." With the first stage in "on" position and the second stage in "off" position, a negative input triggering pulse then turned the first stage "off" and the second stage "on." A circuit of this type is of importance, as mentioned, in digital computer devices and in related counting circuits. The values of the circuit components used in Fig. 3 corresponded to those shown in Fig. 2.

Several explanations have been advanced to explain the occurrence of current multiplication, $\alpha$, in the sense that a hole arriving at the collector may lead to the emission of $(\alpha_1-1)$ extra electrons where $\alpha_1$ is the intrinsic alpha of the collector. In an article by W. Shockley entitled "Theories of High Values of Alpha for Collector Contacts on Germanium," which appeared in "Physical Review," of May 1, 1950, the p-n hook theory was advanced to account for values of alpha greater than 1 found in point-contact transistors. The existence of a so-called "hook" in the electron energy curve was postulated which impeded the "holes" in their progress to the metal contact so that their space charge accumulated, thereby having an enhancing effect on the electrons.

The operation of the junction transistor of the subject invention is believed to be due to the formation of a p-n hook. Without being limited thereby, the operation of this transistor is believed to be as follows. When bias voltages are applied in the conventional manner, which for the example shown requires a positive voltage on the emitter and a negative voltage on the collector both relative to the base, holes will flow out of the emitter into the n-type base and diffuse throughout it. Some of the holes will reach the junction between the n-type base and the thin p-layer, and these will be swept into the p-layer because practically all of the collector voltage appears at this junction owing to the fact that the junction at the other side of the p-layer is biased by the collector bias in the conducting direction. The holes which have entered the p-layer will raise the potential of this region (it will become more positive) which will allow holes to flow into the collector. But if the collector is more strongly n-type than the hook is p-type, an even larger number of electrons will pass from the collector to the hook. Holes swept into the hook are thus neutralized by electrons from the collector. If the lifetime in the hook is large, many electrons will diffuse over into the junction between hook and base. Because of the strong field, these will readily flow into the base region thereby adding to the total current passing the collector-to-base barrier. These currents are additive since holes passing from base to collector comprise a current in the same direction as electrons flowing in the opposite direction. Any electrons attracted into the hook by its positive potential which pass right through into the base do not lower the potential of the hook, and consequently the total electron current may be much larger than the hole current which caused it. Since the collector current is the sum of the electron and hole currents passing the collector barrier whereas the emitted current is essentially the hole current alone (except for some emitted holes which are never collected), it is obvious that very high values of alpha may be obtained. Junction transistors with alphas of twenty and more have been obtained in the practice of this invention. For use in flip-flop computer circuits, it is only necessary that the value of alpha be appreciably larger than 1.

Consideration of the foregoing indicates the desirability for design purposes of choosing high-conductivity collector and emitter regions. Alloyed regions are readily made highly conductive. The intermediate p-layer and the base-connected n region are preferably of low conductivity to enhance minority carrier injection thereinto.

It is readily apparent that this novel type of transistor can be prepared using almost the same equipment, materials and procedures as are at present employed for making n-p-n grown-junction transistors. Essentially, the only change that is required is to move the gold wire, ordinarily connected to the intermediate p-region, a small measured distance, for example, a distance approximately equivalent to the width of the p-layer, into one of the end regions before welding it on.

From the foregoing it will be apparent to those having skill in the transistor art that the illustration given for n-p-n crystals is equally applicable to p-n-p crystals as illustrated in the embodiment shown in Fig. 1A. Furthermore, the transistor action described is believed to work equally well with other semiconductive mateirals such as silicon, lead sulfide and the like, inasmuch as the essence of the invention is believed to be the establishment of a novel type of junction transistor structure utilizing a hook-collector mechanism.

A theoretical model of an n-p-n-p hook-multiplier transistor has been proposed elsewhere. In this model the existence of two central layers, a p-layer and an n-layer, has been postulated. To prepare such a transistor having useful properties, theoretical calculations indicate that the two central layers of opposite conductivity type would both have to be of thin cross section. While, using known techniques, it might be possible to prepare such hook-collector transistor crystals by multiple-doping techniques or possibly by a rate-growing method, such techniques are extremely difficult to apply from practical considerations because two thin adjacent layers must be produced, and external electrical contact made to one of these thin layers. The foregiing type of p-n-p-n transistor of course differs considerably from the practice of the subject invention wherein a known type of junction crystal is grown and an emitter is created as an opposite conductivity type layer in one of the outer semiconductor layers.

In addition to its specific usefulness in telephone switching circuits, a high-alpha junction transistor is useful in most types of computer and flip-flop circuits where power requirements are important and many transistors are employed in a given circuit. These devices are also considered useful in amplifier and oscillator circuits where designs unsuitable for ordinary transistors may be used.

While I have described above the principles of my invention in connection with specific apparatus and method steps, it is to be clearly understood that this description is made only by way of example and not as a limitation to the scope of my invention as set forth in the objects thereof and in the accompanying claims.

I claim:

1. An electrical translating device comprising a body of semi-conductive material having one zone of one conductivity type, an intermediate zone of opposite conductivity type, and means for injecting minority carriers into said intermediate zone consisting of a second zone of said one conductivity type, said first and second zones of said one conductivity type being contiguous with opposite faces of said intermediate zone, means for making an electrical connection to each of said zones of said one conductivity type and further electrical connecting means providing an alloy junction type zone of opposite conductivity in said first zone at a point in adjacent spaced relation to said intermediate zone.

2. A device according to claim 1 wherein said intermediate zone is electrically connected only by the internal contiguity of its opposite faces with said two zones.

3. A device according to claim 1 wherein said further electrical connecting means include an alloyable conductor containing significant amounts of an impurity for forming an alloy junction type zone of opposite conductivity type at a point in adjacent spaced relation to said intermediate zone.

4. A device according to claim 1 wherein said body comprises germanium having significant impurities.

5. A junction transistor comprising a body of semiconductive germanium containing significant impurities having two zones of the same conductivity type separated by an intermediate zone of the opposite conductivity type, said two zones being contiguous with opposite faces of said intermediate zone, collector means for making electrical connection to one of said two zones, base means for making electrical connection to the second of said two zones and connective emitter means providing an alloy-type zone of opposite conductivity type germanium in the second of said two zones at a point in adjacent spaced relation to said intermediate zone.

6. A junction transistor comprising a body of semiconductive germanium containing significant impurities having two zones of n conductivity type separated by an intermediate zone of p-conductivity type, said two n zones being contiguous with opposite faces of said p-zone, collector means for making electrical connection to one of said n zones, base means for making electrical connection to the second of said n zones and connective emitter means providing an alloy-type zone of p-type germanium in the second of said n-zones at a point in adjacent spaced relation to said intermediate zone.

7. A junction transistor according to claim 6 wherein said emitter connective means comprises an alloyable conductor containing significant amounts of acceptor type impurities selected from the group consisting of gallium, indium and aluminum.

8. A junction transistor comprising a body of semiconductive germanium containing significant impurities having two zones of n-conductivity type separated by an intermediate zone of p-conductivity type, said two n zones being contiguous with opposite faces of said p-zone, collector means for making electrical connection to one of said n zones, base means for making electrical connection to the second of said n zones and connective emitter means providing an alloy-type zone of p-type germanium in the second of said n zones at a point in adjacent spaced relation to said intermediate zone, said collector connected n-type germanium being of lower resistivity than said intermediate p-type germanium.

9. A junction transistor comprising a body of semiconductive germanium containing significant impurities having two zones of p-conductivity type separated by an intermediate zone of n-conductivity type, said two p-zones being contiguous with opposite faces of said n zone, collector means for making electrical connection to one of said p-zones, base means for making electrical connection to the second of said p-zones and connective emitter means providing an alloy-type zone of n-type germanium in the second of said p zones at a point in adjacent spaced relation to said intermediate zone.

10. A junction transistor according to claim 6 wherein said emitter connective means comprises an alloyable conductor containing significant amounts of donor type impurities selected from the group consisting of antimony and arsenic.

References Cited in the file of this patent

UNITED STATES PATENTS

| | | |
|---|---|---|
| 2,623,103 | Kircher | Dec. 23, 1952 |
| 2,654,059 | Shockley | Sept. 29, 1953 |
| 2,655,608 | Valdes | Oct. 13, 1953 |
| 2,728,034 | Kurshan | Dec. 20, 1955 |
| 2,795,742 | Pfann | June 11, 1957 |
| 2,821,493 | Carman | Jan. 28, 1958 |
| 2,921,205 | Giacoletto | Jan 12, 1960 |

FOREIGN PATENTS

| | | |
|---|---|---|
| 527,336 | Belgium | Sept. 16, 1954 |

UNITED STATES PATENT OFFICE

Certificate of Correction

Patent No. 2,939,056 May 31, 1960

Fred A. Muller

It is hereby certified that error appears in the above numbered patent requiring correction and that the said Letters Patent should read as corrected below.

Column 1, lines 44 to 47, for $$\alpha=-\left(\frac{\partial i_c}{\partial i_e}\right)v_c=k \qquad \text{read} \qquad \alpha=-\left(\frac{\partial i_c}{\partial i_e}\right)_{v_c=k}$$

column 2, line 59, for "Preferably, the con-" read — Preferably, no con- —; column 5, line 13, for "mateirals" read —materials—; line 31, for "foregiing" read —foregoing—; column 6, line 55, for the claim reference numeral "6" read —9—.

Signed and sealed this 8th day of August 1961.

[SEAL]

Attest:

ERNEST W. SWIDER,
*Attesting Officer.*

DAVID L. LADD,
*Commissioner of Patents.*